(12) United States Patent
Hsu

(10) Patent No.: US 6,503,815 B1
(45) Date of Patent: Jan. 7, 2003

(54) METHOD FOR REDUCING STRESS AND ENCROACHMENT OF SIDEWALL OXIDE LAYER OF SHALLOW TRENCH ISOLATION

(75) Inventor: Shu-Ya Hsu, Yun-Lin (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 09/920,757

(22) Filed: Aug. 3, 2001

(51) Int. Cl.[7] ............................................... H01L 21/76
(52) U.S. Cl. .................... 438/452; 438/424; 438/427; 438/410; 438/430; 438/435; 438/439; 438/444
(58) Field of Search ................... 438/452, 430, 438/424, 435, 439, 444, 427, 770, 773, 787, 410

(56) References Cited

U.S. PATENT DOCUMENTS

| | | | | | |
|---|---|---|---|---|---|
| 4,278,705 A | * | 7/1981 | Agraz-Guerena et al. | ... | 438/452 |
| 4,501,060 A | * | 2/1985 | Frye | ............................. | 29/576 |
| 4,851,078 A | * | 7/1989 | Short et al. | .................... | 437/62 |
| 4,897,362 A | * | 1/1990 | Delgado | ...................... | 438/435 |
| 5,726,091 A | * | 3/1998 | Chao-Chieh | ................ | 438/439 |
| 5,763,315 A | * | 6/1998 | Benedict et al. | ............ | 438/424 |
| 6,008,108 A | * | 12/1999 | Huang et al. | ............... | 438/436 |
| 6,114,258 A | * | 9/2000 | Miner et al. | ................ | 438/216 |
| 6,313,007 B1 | * | 11/2001 | Ma et al. | ..................... | 257/510 |

* cited by examiner

*Primary Examiner*—Stephen D. Meier
*Assistant Examiner*—Khanh B. Duong

(57) ABSTRACT

The invention utilizes introductions of oxygen and hydroxyl to perform an in situ steam generated process to reoxidize a conventional sidewall oxide layer and density the oxide in a shallow trench isolation. The ISSG process renders the conventional sidewall oxide layer much less stress and encroachment. The electrical property of the active regions and the isolation quality between the active regions can be assured. The ISSG process can densify the oxide in a shallow trench isolation to prevent the oxide from being lost in the following clean process.

12 Claims, 3 Drawing Sheets

METHOD FOR REDUCING STRESS AND ENCROACHMENT OF SIDEWALL OXIDE LAYER OF SHALLOW TRENCH ISOLATION

BACKGROUND OF THE INVENTION

1. Field of the Invention

The present invention relates to a method for processing a sidewall oxide layer of a shallow trench isolation and densifying the oxide in a shallow trench isolation, and more particularly to a method for reducing a stress and encroachments of a sidewall oxide layer of a shallow trench isolation.

2. Description of the Related Art

As the density of integrated circuits increases, the dimension of an isolation region between active regions in semiconductor devices decreases. With this trend, the conventional local oxidation of silicon (LOCOS) method for isolating active regions, which forms a field oxide layer by using a thermal oxidation technique, confronts the limit in the effective isolation length, thereby degrading characteristics of the isolation region. Furthermore, the conventional LOCOS method possesses some inherent drawbacks resulting from the processes, i.e., lateral oxidation of the silicon underneath the silicon nitride mask, making the edge of the field oxide resemble the shape of a bird's beak.

According to the disadvantages for LOCOS isolation structures mentioned above, an isolation technique using trenches has been developed. Generally, the trench isolation includes the steps of etching a silicon substrate to form a trench, depositing a oxide layer by using a chemical vapor deposition (CVD) process to fill up the trench, providing the oxide layer a planarized surface by using a chemical mechanical polish (CMP) process, and removing the oxide layer upon the active regions.

According to the technique, the semiconductor substrate is etched at a predetermined depth, thereby providing excellent characteristics of the device isolation. Furthermore, the field oxide layer is formed by using a CVD technique, so that the device isolation region that is defined by a photolithography process can be maintained throughout. The device isolation technique set forth is also known as shallow trench isolation (STI) processes. However, conventional shallow trench isolation processes still have several drawbacks. FIG. 1 shows a cross-sectional diagram of a shallow trench isolation amid a STI conventional process. A silicon substrate 100, a silicon dioxide layers 102, a silicon nitride layer 104 and a silicon dioxide layer 108 are shown in FIG. 1. A sidewall oxide layer 106 is formed over the trench by conventional oxidation processes such as dry or wet thermal oxidation. The sidewall oxide layer 106 is used to eliminate etching induced damage and reduce stress resulting from the following filling of the silicon dioxide 108 layer by conventional chemical vapor deposition. To further reduce the stress, a sidewall reoxidation is usually performed. The conventional sidewall reoxidation is usually a wet oxidation which would result in additional stress and encroachment problems. An encroachment 107 or a bird's beak is shown in FIG. 1. The encroachment 107 is formed because $H_2O$ molecules and $O_2$ always diffuse into the interface of the silicon substrate 100 and the silicon dioxide layer 102. The large stress and the encroachment 107 usually presents defects in neighboring active regions. The defects will result leakage current and degrade the reliability of neighboring devices.

In view of the drawbacks mentioned with the prior art process, there is a continued need to develop new and improved processes that overcome the disadvantages associated with prior art processes. The requirements of this invention are that it solves the problems mentioned above.

SUMMARY OF THE INVENTION

It is therefore an object of the invention to provide a processing method for reducing the stress and preventing the encroachment of a sidewall oxide layer of a STI.

It is another object of this invention to provide a STI process which can assure the electrical property of the active regions.

It is a further object of this invention to provide a reliable STI process which can assure the isolation quality between the active regions.

It is another object of this invention to densify the oxide in a shallow trench isolation to prevent the oxide from being lost in the following clean process.

To achieve these objects, and in accordance with the purpose of the invention, the invention uses a method comprising: providing a substrate having a first dielectric layer thereon and a second dielectric layer over said first dielectric layer; forming a trench into said substrate; forming a sidewall oxide layer on the sidewall and bottom of said trench; filling said trench with a dielectric material; and performing an in situ steam generated process comprising introducing hydroxyl to reoxidize said sidewall oxide layer and densify the oxide in a shallow trench isolation.

It is to be understood that both the foregoing general description and the following detailed description are exemplary and explanatory only and are not restrictive of the invention, as claimed.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

It is to be understood and appreciated that the process steps and structures described below do not cover a complete process flow. The present invention can be practiced in conjunction with various integrated circuit fabrication techniques that are used in the art, and only so much of the commonly practiced process steps are included herein as are necessary to provide an understanding of the present invention.

The present invention will be described in detail with reference to the accompanying drawings. It should be noted that the drawings are in greatly simplified form and they are not drawn to scale. Moreover, dimensions have been exaggerated in order to provide a clear illustration and understanding of the present invention.

Figure 1:
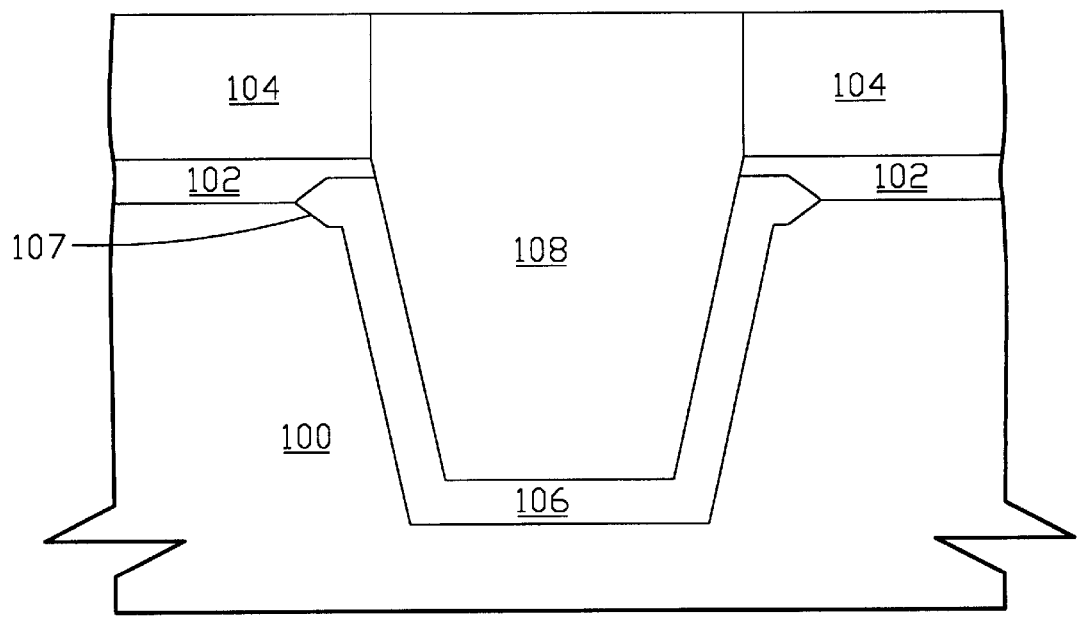
FIG. 1 shows a cross-sectional diagram of a shallow trench isolation amid a STI conventional process.
Figure 2A:
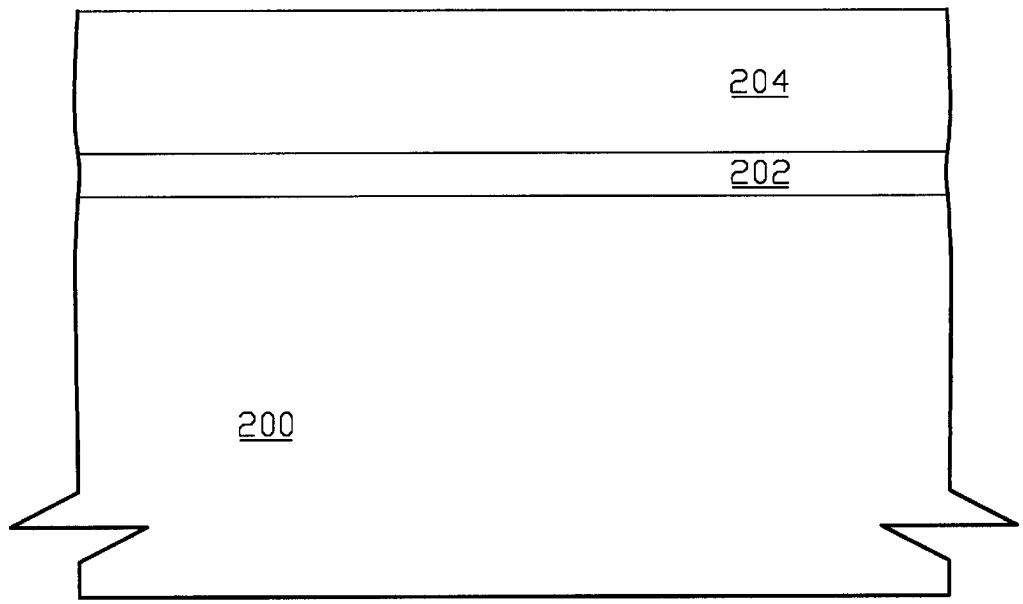
FIG. 2A shows two dielectric layers sequentially formed over a substrate.

Referring to FIG. 2A, dielectric layers 202 and 204 are sequentially formed over a substrate 200. The substrate 200 preferably comprises, but is not limited to: a silicon substrate with a <100> crystallographic orientation. The substrate can also comprise other semiconductor substrate such as a SOI (Silicon On Insulator)substrate. The dielectric layer 202 preferably comprises, but is not limited to: a silicon dioxide layer formed by a thermal growth process. The dielectric layer 202 has a thickness of from about 20 angstrom to about 300 angstrom. The dielectric layer 204 preferably comprises a silicon nitride layer formed by conventional methods such as chemical vapor deposition, but other material met the spirit of this invention should not be excluded. The silicon nitride layer 204 preferably has a thickness of from about 100 angstrom to about 2000 angstrom.

Figure 2B:
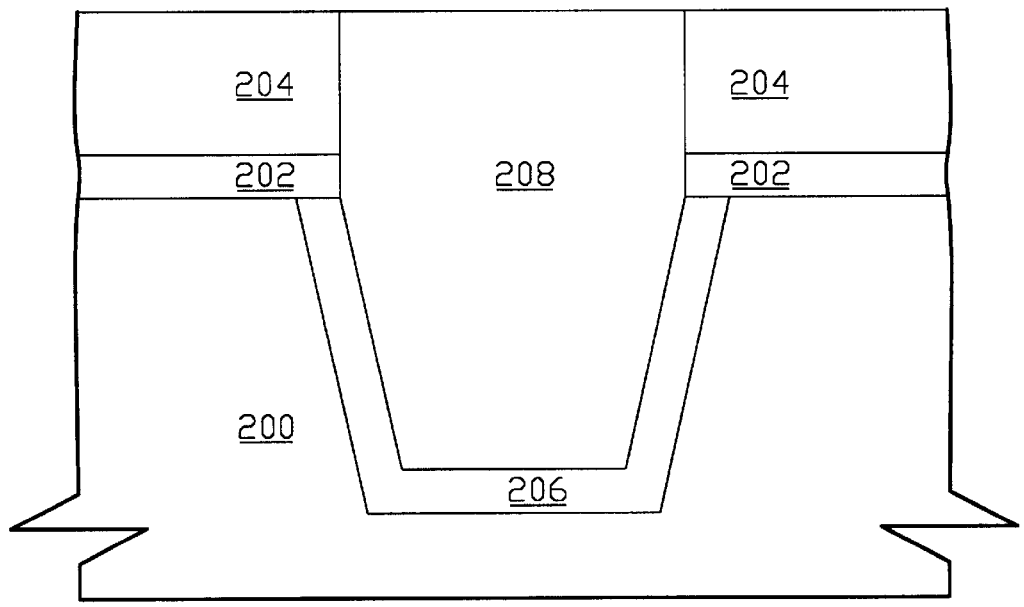
FIG. 2B shows a result of forming a trench into the structure shown in FIG. 2A, conformally forming a dielectric layer thereon and filling the trench.
Figure 3:
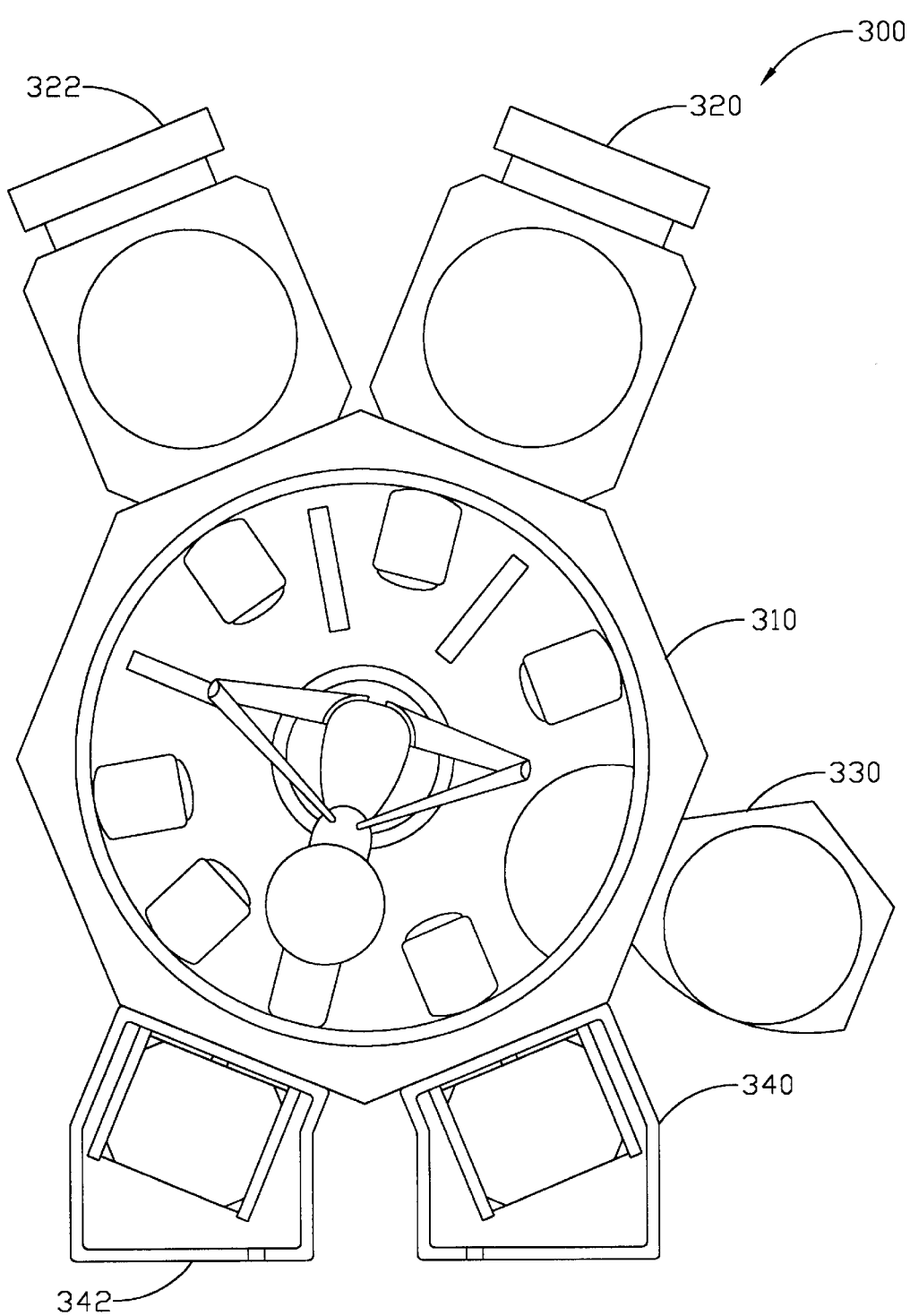
FIG. 3 shows a schematic diagram of a process system.

Referring to FIG. 2B, a trench is formed by etching the dielectric layer 204, the dielectric layer 202 and the substrate 200 and a dielectric layer 206 is conformally formed over the trench. The depth of the trench depends on what kind of device the STI isolates, for example, the depth is about 2500 angstrom to about 4500 angstrom for a flash memory and it is about 2000 angstrom to about 4000 angstrom for a logic device such as a metal oxide semiconductor(MOS)transistor. The trench is preferably formed by anisotropic etching such as reactive ion etching, but other conventional etching method should also be used. The dielectric layer 206 comprises a silicon dioxide layer formed by conventional dry or wet oxidation process. The dielectric layer 206 has a thickness of from about 50 angstrom to about 500 angstrom. A dielectric layer 208 is formed to fill the trench. The dielectric layer 208 preferably comprises a silicon dioxide layer formed by conventional chemical vapor deposition processes such as low pressure chemical vapor deposition (LPCVD) and high density plasma chemical vapor deposition (HDPCVD). To reduce the stress and encroachment of the dielectric layer 206, an in situ steam generated process is performed in a conventional furnace, but is preferably in a rapid thermal processing (RTP )chamber and specially in a single wafer RTP chamber. There are numerous processing equipment can be used to perform an ISSG process. FIG. 3 shows a Centura® 5000 system 300 marketed by the Applied Materials Corporation. A rapid thermal processing chamber 320 is bolted to a vacuum transfer chamber 310. There are also a process chamber 322, a cool down chamber 330 and vacuum cassette loadlocks 340 and 342 bolted to the vacuum transfer chamber 310. The dielectric layer 206 is reoxidized in an atmosphere comprising oxygen and hydroxyl and at a temperature between about 700° C. to about 1200° C. The flow rate of oxygen is from about 1 sccm (Standard Cubic Centimeter per Minute) to about 30 sccm, and the flow rate of hydrogen is from about 0.1 sccm to about 15 sccm. The processing time of this ISSG process is from about 1 minute to about 5 minute.

The invention utilizes introductions of oxygen and hydroxyl to perform an in situ steam generated process to reoxidize a conventional sidewall oxide layer and densify the oxide in a shallow trench isolation. The ISSG process renders the conventional sidewall oxide layer much less stress and encroachment. The electrical property of the active regions and the isolation quality between the active regions can be assured. The ISSG process can densify the oxide in a shallow trench isolation to prevent the oxide from being lost in the following clean process.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method for reducing a stress and encroachments of a sidewall oxide layer of a shallow trench isolation, said method comprising:

providing a substrate having a first dielectric layer thereon and a second dielectric layer over said first dielectric layer;

forming a trench into said substrate;

forming a sidewall oxide layer on the sidewall and bottom of said trench;

filling said trench with a dielectric material; and performing an in situ steam generated process in an atmosphere comprising oxygen and hydroxyl.

2. The method according to claim 1, wherein said first dielectric layer comprises a silicon dioxide layer.

3. The method according to claim 1, wherein said second dielectric layer comprises a silicon nitride layer.

4. The method according to claim 1, wherein said in situ steam generated process is performed in a rapid thermal processing chamber.

5. The method according to claim 1, wherein said in situ steam generated process is performed at a temperature of from about 700° C. to about 1200° C.

6. The method according to claim 1, wherein said sidewall oxide layer is formed by a wet thermal oxidation process.

7. A method for reducing a stress and encroachments of a sidewall oxide layer of a shallow trench isolation, said method comprising:

providing a substrate having a silicon dioxide layer thereon and a silicon nitride layer over said silicon dioxide layer;

forming a trench into said substrate;

forming a sidewall oxide layer on the sidewall and bottom of said trench;

filling said trench with a dielectric material; and performing an in situ steam generated process in an atmosphere comprising oxygen and hydroxyl to reoxidize said sidewall oxide layer at a temperature of from about 700° C. to about 1200° C.

8. The method according to claim 7, wherein said trench is formed by a reactive ion etching process.

9. The method according to claim 7, wherein said in situ steam generated process is performed in a rapid thermal processing chamber.

10. A method for reducing a stress and encroachments of a sidewall oxide layer of a shallow trench isolation, said method comprising:

providing a substrate having a silicon dioxide layer thereon and a silicon nitride layer over said silicon dioxide layer;

forming a trench into said substrate by a dry etching process; forming a sidewall oxide layer on the sidewall and bottom of said trench; filling said trench with a dielectric material; and performing an in situ steam generated process in an atmosphere comprising oxygen and hydroxyl to reoxidize said sidewall oxide layer at a temperature of from about 700° C. to about 1200° C. in a rapid thermal processing chamber.

11. The method according to claim 10, wherein said dry etching process comprises a reactive ion etching process.

12. The method according to claim 10, wherein said rapid thermal processing chamber comprises a single wafer chamber.

* * * * *